United States Patent
Costa et al.

(10) Patent No.: US 6,724,235 B2
(45) Date of Patent: Apr. 20, 2004

(54) BICMOS VARIABLE-GAIN TRANSCONDUCTANCE AMPLIFIER

(75) Inventors: Damian Costa, San Diego, CA (US); John B. Groe, Poway, CA (US); Michael Farias, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 10/202,502

(22) Filed: Jul. 23, 2002

(65) Prior Publication Data

US 2003/0090323 A1 May 15, 2003

Related U.S. Application Data

(60) Provisional application No. 60/307,352, filed on Jul. 23, 2001.

(51) Int. Cl.[7] ............................................... H03K 17/14
(52) U.S. Cl. ........................ 327/378; 327/513; 330/254
(58) Field of Search ................................ 327/512, 350, 327/359, 362, 437, 103, 378, 513; 330/254, 51

(56) References Cited

U.S. PATENT DOCUMENTS

| 5,880,631 A | * | 3/1999 | Sahota ........................ 330/51 |
| 6,229,374 B1 | * | 5/2001 | Tammone, Jr. .............. 327/350 |
| 6,259,321 B1 | * | 7/2001 | Song et al. .................. 330/254 |

OTHER PUBLICATIONS

Behzad Razavi, "Design of Analog CMOS Integrated Circuits", pp 392, McGraw Hill Publishing.

* cited by examiner

Primary Examiner—Dinh T. Le

(57) ABSTRACT

A variable-gain BiCMOS transconductance amplifier (VGA). An NMOS differential pair amplifier with bipolar cascoding provides continuous gain control by adjustment of drain-source voltage to shift the NMOS differential pair from a saturation region operation and high gain to a triode operation and low gain. A simple control circuit is used in order to generate the desired exponential gain to linear control voltage characteristic that is stable over temperature and process. The shift from saturation to triode operation of the input NMOS differential pair simultaneously increases the input linearity as the gain is reduced.

15 Claims, 3 Drawing Sheets

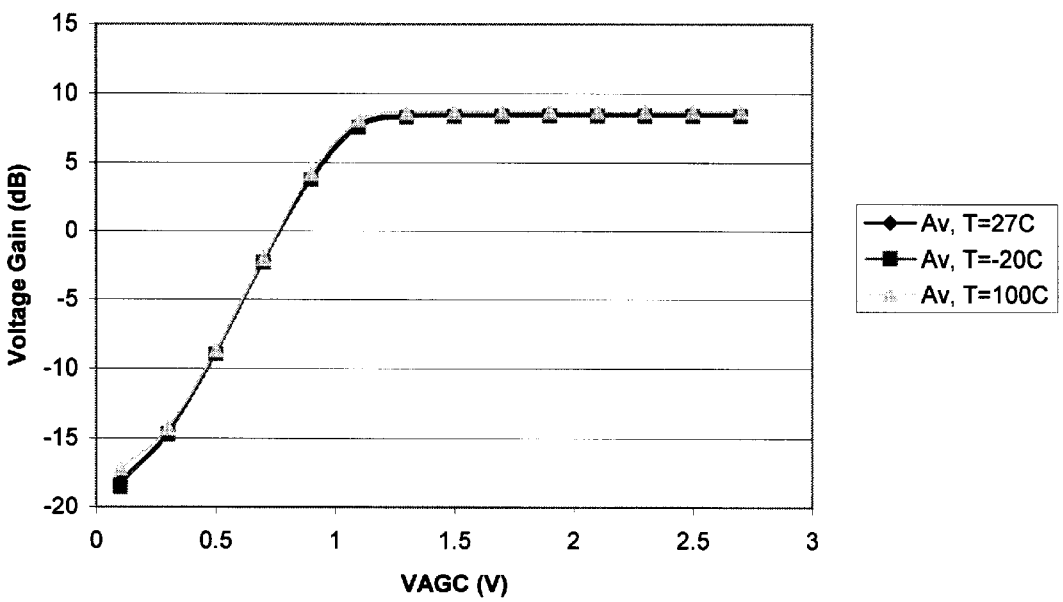
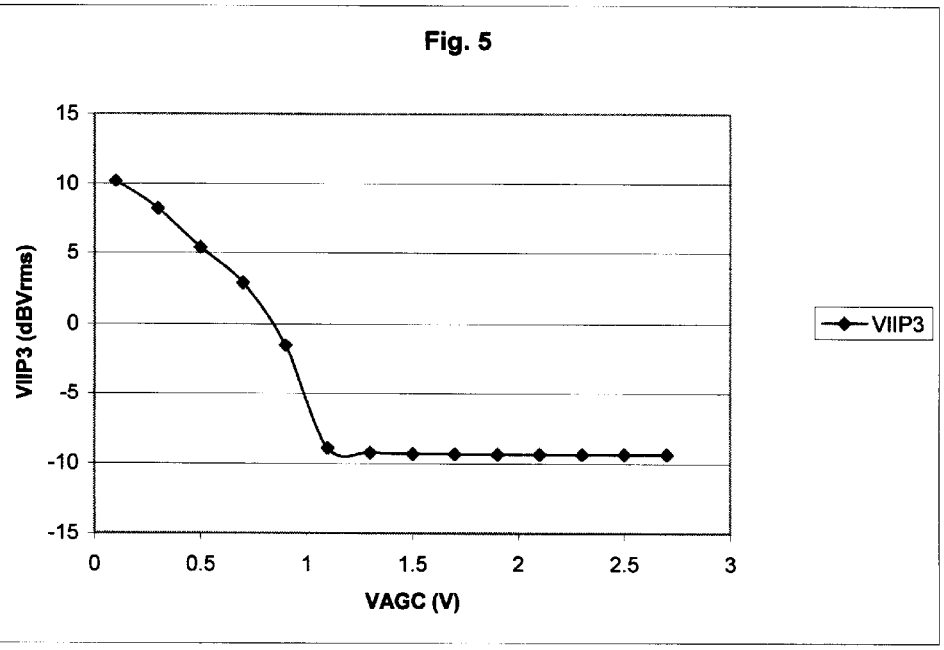

BICMOS VARIABLE-GAIN TRANSCONDUCTANCE AMPLIFIER

CROSS REFERENCE TO RELATED APPLICATIONS

This Application claims the benefit of priority of a pending U.S. Provisional Patent Application entitled "A BiCMOS VARIABLE-GAIN TRANSCONDUCTANCE AMPLIFIER" Serial No. 60/307,352 filed on Jul. 23, 2001, the disclosure of which is incorporated by reference herein in its entirety for all purposes.

FIELD OF THE INVENTION

The present invention relates to generally to amplifier circuits, and more particularly, to a BiCMOS transconductor amplifier.

BACKGROUND OF THE INVENTION

Received signals in wireless communications often vary in strength, as a result, variable gain amplifiers (VGA's) are commonly used to allow a downstream signal processor to properly demodulate the wanted information. Desired characteristics for a VGA in a modern radio receiver include an exponential gain to linear control voltage characteristic, temperature stable gain, increased input linearity as the gain is reduced (increasing incoming signal strength), and a simple, low-current consuming circuit topology. While CMOS VGA's are low cost and can be made highly linear, a straightforward, low-power means for generating the desired exponential (dB-linear) gain characteristic, with small process and temperature variation is not available.

Accordingly, a need remains for a simple, continuous VGA that exploits the benefits of NMOS devices, while still providing all the desired VGA characteristics mentioned above.

SUMMARY OF THE INVENTION

The present invention includes a variable-gain BiCMOS transconductance amplifier (VGA). In one embodiment, an NMOS differential pair amplifier with bipolar cascoding provides continuous gain control by adjustment of drain-source voltage to shift an input NMOS differential pair from a saturation region operation and high gain to a triode operation and low gain. A simple control circuit is used in order to generate the desired exponential gain to linear control voltage characteristic that is stable over temperature and process. The shift from saturation to triode operation of the input NMOS differential pair simultaneously increases the input linearity as the gain is reduced.

In one embodiment, the amplifier is based on an NMOS differential pair cascoded with a pair of npn bipolar devices. The gain is controlled by adjusting the drain-source voltage ($V_{DS}$) of the NMOS differential pair via a control voltage ($V_{control}$) applied at the bases of the npn devices. The resulting shift in $V_{DS}$ moves the NMOS devices from a saturation region in high gain to a triode region in low gain. The gain cell of the VGA incorporates a simple, robust structure with only four active transistors. The VGA employs a straightforward gain control circuit to achieve the desired dB-linear gain characteristic that is relatively insensitive to temperature and process variation. A further aspect of the VGA circuit is that the input linearity is enhanced as the gain is reduced.

In one embodiment, a variable-gain amplifier is provided that amplifies an input signal to produce an amplified output signal, and wherein the amplifier provides an exponential gain to linear control voltage characteristic. The amplifier comprises a control voltage generator that generates a first control signal and receives a second control signal. The amplifier also comprises an input transconductance stage that receives the input signal and provides the second control signal at an output terminal. The amplifier also comprises a cascode transistor pair that is coupled to the input transconductance stage, the cascode transistor pair receives the first control signal and generates the amplified output signal, and an output load coupled to the amplified output signal.

In one embodiment, a method is provided for amplifying an input signal to produce an amplified output signal, wherein the method provides an exponential gain to linear control voltage characteristic. The method comprises the steps of receiving the input signal at a transconductance stage that is coupled to a cascode transistor pair, generating a first control signal that is input the cascode transistor pair, receiving a second control signal that is provided at an output terminal of the transconductance stage that is also coupled to a current source, and providing a load that is coupled to the amplified output signal produced at an output of the cascode transistor pair.

In one embodiment, a radio receiver is provided that receives and processes radio frequency (RF) transmissions and includes a variable-gain amplifier that amplifies an input signal derived from the RF transmissions to produce an amplified output signal, and wherein the amplifier provides an exponential gain to linear control voltage characteristic. The amplifier comprises a control voltage generator that generates a first control signal and receives a second control signal. The amplifier also comprises an input transconductance stage that receives the input signal and provides the second control signal at an output terminal. The amplifier also comprises a cascode transistor pair that is coupled to the input transconductance stage, the cascode transistor pair receives the first control signal and generates the amplified output signal, and an output load coupled to the amplified output signal.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 4 is a graph illustrating voltage gain versus AGC voltage for the amplifier of FIG. 1 at temperatures of −20, 27, and 100 degrees C.; and FIG. 5 is a graph showing an input third-order intercept point voltage versus AGC voltage for the amplifier of FIG. 1.

DETAILED DESCRIPTION

Figure 1:
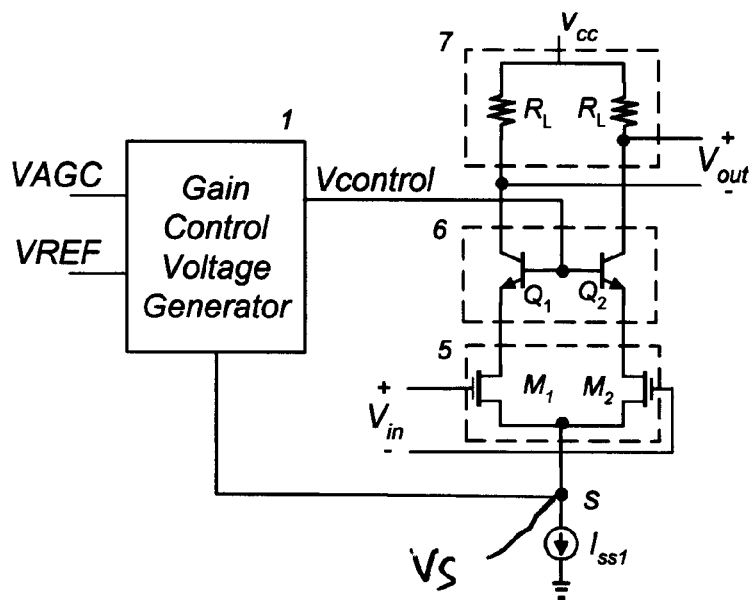
FIG. 1 is a circuit schematic of a variable-gain transconductance amplifier constructed in accordance with the present invention.

FIG. 1 shows a continuous BiCMOS variable-gain transconductance amplifier constructed in accordance with the present invention. The circuit of FIG. 1 includes a gain control voltage generator 1, an input transconductance stage 5, a cascode pair 6, and an output load 7.

The input stage 5 consists of an NMOS differential pair M1, M2 with a common source terminal (S) having a voltage (Vs) and connected to current source $I_{ss1}$ and the gain control generator 1. The drain terminals of M1 and M2 are tied to emitters of Q1 and Q2 that form the npn bipolar cascode pair 6. Output resistors RL are connected to collector terminals of Q1 and Q2. The base terminals of Q1 and Q2 are driven by a control voltage ($V_{control}$) that is output from the gain control generator 1. The gain control generator 1 has as its inputs an automatic gain control voltage ($V_{AGC}$) and a reference voltage ($V_{REF}$), which may be provided by a baseband processor (not shown).

The voltage gain of the amplifier of FIG. 1 can be shown to be:

$$A_v = \frac{g_{m_1}}{1 + \frac{V_T}{V_{DS_1}}} R_L \qquad (1)$$

where $g_{m1}$ is the transconductance of M1 and $V_T$=KT/q. Since in general $g_{m1}$ is a function of $V_{DS1}$, variable gain is achieved by tuning $V_{DS1}$, which in turn is adjusted via the control voltage $V_{control}$ applied to the bases of Q1 and Q2. The drain-source voltage of M1 can be expressed as:

$$V_{DS1} = V_{control} - V_{BE1} - V_S \qquad (2)$$

where $V_{BE1}$ is the base-emitter voltage of Q1. When M1 operates in saturation, shallow triode, or medium triode regions ($V_T/V_{DS1}$<<1), equation 1 simplifies to:

$$A_v' = g_{m_1} R_L \qquad (3)$$

Maximum gain occurs when M1 operates in the saturation region. For long channel devices:

$$g_{m_1}^{sat} = \sqrt{k_n I_{ss1}} \qquad (4)$$

where $k_n$ is the device-transconductance parameter. It is well known to those versed in the art that if the source current $I_{ss1}$ is derived from a constant-$g_m$ biasing circuit (not shown), $I_{ss1}$ can be expressed as:

$$I_{ss_1} \sim \frac{1}{k_n R_b^2} \qquad (5)$$

where $R_b$ is the biasing-setting resistor in the constant-$g_m$ biasing circuit. The maximum gain can then be expressed as:

$$A_v^{max} = \frac{R_L}{R_b} \qquad (6)$$

and is made independent of both temperature and process, assuming $R_L$ and $R_b$ are the same type of resistors. From equation (2), it can be seen that as $V_{control}$ is reduced, $V_{DS1}$ also decreases, and transistors M1 and M2 are shifted from operating in the saturation region to the triode region. In the triode region, $$g_{m_1}^{tri} = k_n V_{DS_1} \qquad (7)$$

and $$A_v^{tri} = k_n V_{DS_1} R_L \qquad (8)$$

for shallow and medium triode operation. For deep triode region (when $V_T/V_{DS1} \approx 1$), the $V_T/V_{DS1}$ term in the denominator of equation (1) cannot be neglected.

In one embodiment, the gain control generator 1 gives $V_{control}$ the proper functional dependence so that the voltage gain takes on the desired near exponential dependence with respect to $V_{AGC}$ and is independent of temperature and process.

Figure 2:
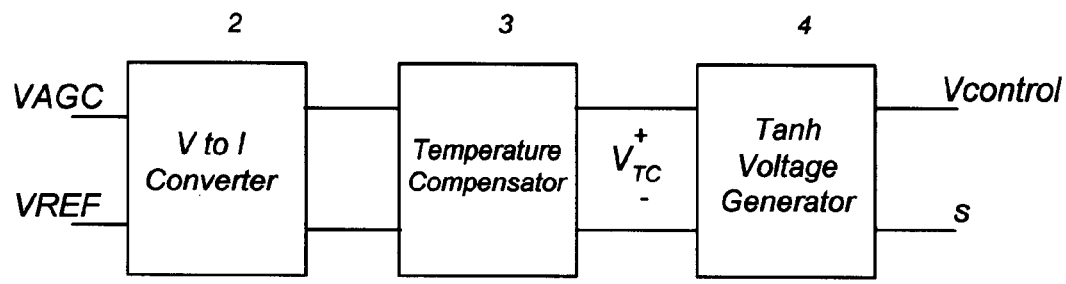
FIG. 2 is a block diagram of a gain control voltage generator for use in the amplifier of FIG. 1.

FIG. 2 shows a block diagram of the gain control voltage generator 1. The generator consists of a voltage-to-current converter 2, a temperature compensation circuit 3, and a hyperbolic tangent voltage generator 4. The inputs are $V_{AGC}$ and a reference voltage $V_{REF}$, which is the maximum value of $V_{AGC}$. The input voltages are converted to currents by the voltage-to-current converter 2 using circuitry that is well known to those versed in the art. The output currents of the voltage-to-current converter are input to the temperature compensation circuit 3. The temperature compensation circuit 3 is a translinear current amplifier, which scales the ratio of its input currents proportional to absolute temperature to produce scaled output currents. These scaled output currents are routed through resistive elements (not shown) to develop a differential output voltage expressed as:

$$V_{TC} \sim V_T \left( \frac{V_{REF} - V_{AGC}}{V_{REF}} \right) \qquad (9)$$

which is linearly proportional to temperature (via $V_T$) and a normalized, level shifted version of $V_{AGC}$. The detailed operation of the translinear current amplifier for temperature compensation is well known in the art and therefore not presented here. The hyperbolic tangent voltage generator 4 is discussed in the following text.

Figure 3:
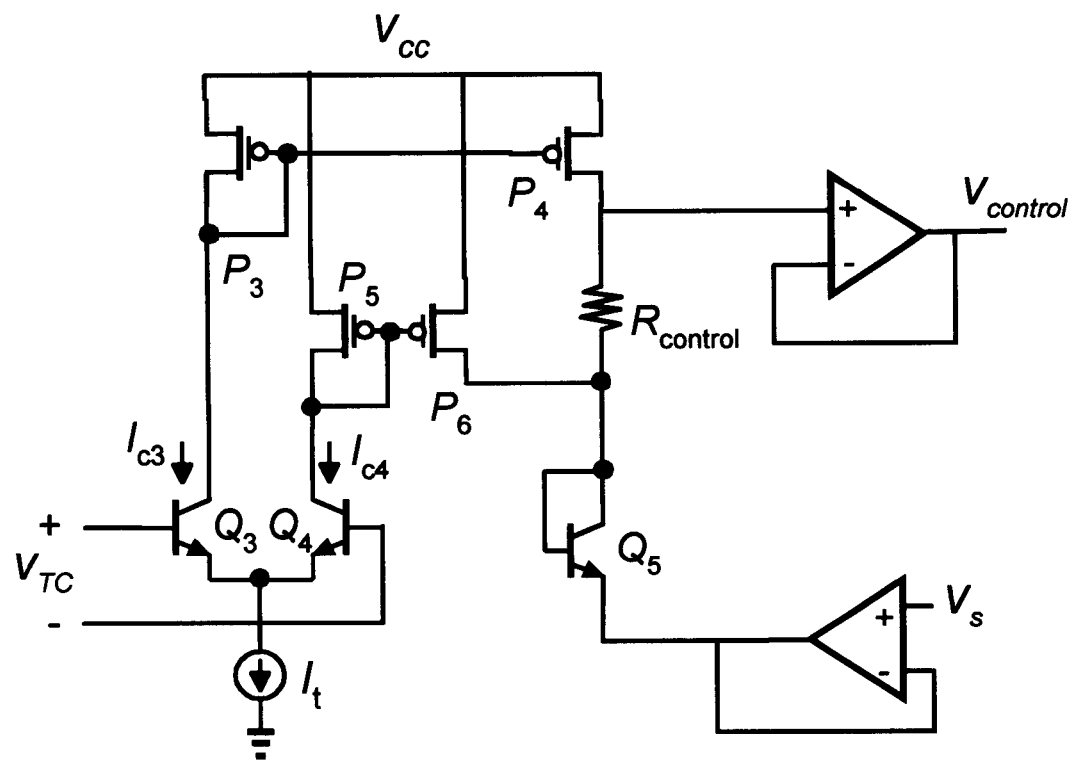
FIG. 3 is a circuit schematic of a hyperbolic tangent voltage generator for use in the gain control voltage generator of FIG. 2.

FIG. 3 shows a detailed diagram of one embodiment of a hyperbolic tangent voltage generator 4. The output voltage $V_{TC}$ of the temperature compensation circuit 3 is applied to the bases of a bipolar differential pair Q3, Q4 at the input of the hyperbolic tangent voltage generator 4. A tail current $I_t$ is derived from a constant-$g_m$ biasing cell and is inversely proportional to the device-transconductance so that:

$$I_t \sim \frac{1}{k_n R_b^2} \qquad (10)$$

The resulting collector currents $I_{c3}$ and $I_{c4}$ may be written as:

$$I_{c_3}, I_{c_4} = I_t \left[ 1 \pm \tanh\left(-\frac{V_{TC}}{2V_T}\right) \right] \sim \frac{1}{k_n R_b^2} [1 \pm \tanh[c(V_{AGC} - V_{REF})]] \qquad (11)$$

where c is a constant and the temperature effect of $V_T$ has been cancelled. Two PMOS mirrors consisting of FETs P3, P4, P5, and P6 are connected to the outputs of differential pair Q3, Q4. The mirrored tanh currents at the output of FETs P4 and P6 are routed to the opposite sides of resistor $R_{control}$, which is used to produce the control voltage $V_{control}$. Thus, $V_{control}$ is given by the expression:

$$V_{control} = I_{d4} R_{control} + V_{BE5} + V_S \qquad (12)$$

where $V_s$ is the buffered source voltage at terminal S of M1 in FIG. 1. $V_{control}$ is then passed through a unity-gain buffer and applied to the bases of Q1 and Q2 in FIG. 1. The collector current of Q5 is the sum of the mirrored versions of $I_{c3}$ and $I_{c4}$ and is a fixed current, inversely proportional to $k_n$. Since the collector currents of Q1 and Q2 are also inversely proportional to $k_n$, the size of Q5 is scaled compared to that of Q1 and Q2 so that equal collector current densities flow through all three devices. This insures that:

$$V_{BE5} = V_{BE1} = V_{BE2} \qquad (13)$$

With the substitution of equations (12) and (13) into equation (2), the drain-source voltage of M1 becomes:

$$V_{DS_1} = I_{d_4} R_{control} \sim \frac{R_{control}}{k_n R_b^2}[1 \pm \tanh[c(V_{AGC} - V_{REF})]] \quad (14)$$

and thus, $V_{DS1}$ is mapped to a tanh function with respect to $V_{AGC}$ and is inversely proportional to $k_n$.

Finally, substitution of equation (14) into equation (8) leads to:

$$A_v^{tri} \sim \frac{R_{control} R_L}{R_b^2}[1 \pm \tanh[c(V_{AGC} - V_{REF})]] \quad (15)$$

where the $k_n$ dependence has been cancelled. Since the function 1+tanh(u) behaves as an exponential for values of u<tanh$^{-1}$(-½), the desired dB-linear voltage gain control characteristic has been achieved. Furthermore, if Rcontrol, $R_L$ and $R_b$ are the same type of resistor, the gain is independent of temperature and process for shallow and medium triode region operation (as was also the case for saturation region operation).

The above embodiment is described with reference to the hyperbolic voltage generator 4 of FIG. 3, where the voltage generator provides an approximation to an exponential function. Thus, it will be apparent to one with skill in the art that other circuits capable of providing an exponential function can be used in place of the hyperbolic voltage generator 4 to generate the $V_{control}$ signal within the scope of the present invention. For example, it is possible to use a more complicated exponential voltage generation circuit in place of the hyperbolic voltage generator 4 to generate the $V_{control}$ signal.

FIG. 4 shows VGA voltage gain at 500 KHz as a function of $V_{AGC}$ with source $I_{ss1}$=750 uA for temperatures T=-20, 27, and 100 degrees C. Over most of the AGC range, the gain variation over temperature is less than +/-0.2 dB. At very low $V_{AGC}$ when M1 and M2 operate in very deep triode region, the gain variation over temperature increases slightly due to the temperature dependence of the $V_T/V_{DS1}$ term in equation (1). In this embodiment, the single-stage VGA achieves a gain control range of 25 dB.

Thus, the embodiment of the amplifier constructed according to the present invention and discussed above, provides the wanted near exponential gain control characteristic, and achieves the desired increased linearity with gain reduction.

FIG. 5 shows the input third-order intermodulation intercept point voltage in dVB$_{rms}$ with $I_{ss1}$=750 uA, Vcc=2.7V, and T=27C. As can be seen from FIG. 5, the linearity improves as the gain is reduced because devices M1 and M2 shift from saturation region operation to triode region operation.

The present invention includes a variable-gain BiCMOS transconductor amplifier. The amplifier is suitable for use in radio receivers that receive and process radio frequency (RF) transmissions to provide a low-power means for generating the desired exponential (dB-linear) gain characteristic with small process and temperature variations. For example, in one embodiment, the amplifier is used in a cellular telephone to process received cellular transmissions.

The embodiments described herein are illustrative of the present invention and are not intended to limit the scope of the invention to the particular embodiments described. Accordingly, while one or more embodiments of the invention have been illustrated and described, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. A variable-gain amplifier that amplifies an input signal to produce an amplified output signal and wherein the amplifier provides an exponential gain to linear control voltage characteristic, the amplifier comprising:

a control voltage generator that generates a first control signal in response to a second control signal;

an input transconductance stage that receives the input signal and provides the second control signal at a signal terminal that is coupled to the control voltage generator;

a cascode transistor pair that is coupled to the input transconductance stage, the cascode transistor pair receives the first control signal and generates the amplified output signal; and an output load coupled to the amplified output signal.

2. The amplifier of claim 1, further comprising a current source coupled to the signal terminal of the transconductance stage.

3. The amplifier of claim 1, wherein the control voltage generator comprises:

a voltage to current converter that receives a gain control voltage input and produces a converted current output;

a temperature compensator that receives the current output and generates a compensation voltage; and a hyperbolic tangent voltage generator that receives the compensation voltage and generates the first control signal based on the second control signal.

4. The amplifier of claim 3, wherein the hyperbolic tangent voltage generator comprises:

a first transistor pair that receives the compensation voltage; and first and second mirror circuits coupled to the first transistor pair and producing first and second mirror currents that are used to produce the first control signal.

5. The amplifier of claim 4, wherein the hyperbolic tangent voltage generator further comprises a control resistor coupled between the first and second mirror circuits.

6. The amplifier of claim 5, wherein the hyperbolic tangent voltage generator further comprises first and second buffers coupled to the first and second mirror circuits to buffer the first and second control signals.

7. A method for amplifying an input signal to produce an amplified output signal, wherein the method provides an exponential gain to linear control voltage characteristic, the method comprising steps of:

receiving the input signal at a transconductance stage that is coupled to a cascode transistor pair;

generating a first control signal that is input to the cascode transistor pair in response to a second control signal that is provided at a signal terminal of the transconductance stage that is also coupled to a current source;

generating the amplified output signal at an output of the cascode transistor pair; and providing a load that is coupled to the amplified output signal.

8. The method of claim 7, wherein the step of generating further comprises steps of:

converting at least one gain control voltage signal to a current signal;

temperature compensating the current signal to produce a compensated voltage signal; and using the compensated voltage signal and the second control signal to produce the first control signal.

9. The method of claim 8, wherein the step of using further comprises:

receiving the compensated voltage at a first transistor pair;

outputting signals from the first transistor pair to first and second mirror circuits;

receiving the second control signal at the second mirror circuit; and generating the first control signal from the first mirror circuit.

10. In a radio receiver that receives and processes radio frequency (RF) transmissions, a variable-gain amplifier that amplifies an input signal derived from the RF transmissions to produce an amplified output signal, and wherein the amplifier provides an exponential gain to linear control voltage characteristic, the amplifier comprising:

a control voltage generator that generates a first control signal in response to a second control signal;

an input transconductance stage that receives the input signal and provides the second control signal at a signal terminal that is coupled to the control voltage generator;

a cascode transistor pair that is coupled to the input transconductance stage, the cascode transistor pair receives the first control signal and generates the amplified output signal; and an output load coupled to the amplified output signal.

11. The amplifier of claim 10, further comprising a current source coupled to the signal terminal of the transconductance stage.

12. The amplifier of claim 10, wherein the control voltage generator comprises:

a voltage to current converter that receives a gain control voltage input and produces a converted current output;

a temperature compensator that receives the current output and generates a compensation voltage; and a hyperbolic tangent voltage generator that receives the compensation voltage and generates the first control signal based on the second control signal.

13. The amplifier of claim 12, wherein the hyperbolic tangent voltage generator comprises:

a first transistor pair that receives the compensation voltage; and first and second mirror circuits coupled to the first transistor pair and producing first and second mirror currents that are used to produce the first control signal.

14. The amplifier of claim 13, wherein the hyperbolic tangent voltage generator further comprises a control resistor coupled between the first and second mirror circuits.

15. The amplifier of claim 14, wherein the hyperbolic tangent voltage generator further comprises first and second buffers coupled to the first and second mirror circuits to buffer the first and second control signals.

* * * * *